(12) United States Patent
Kim

(10) Patent No.: US 7,005,890 B2
(45) Date of Patent: Feb. 28, 2006

(54) DEVICE FOR GENERATING A BIT LINE SELECTION SIGNAL OF A MEMORY DEVICE

(75) Inventor: Young Soo Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 42 days.

(21) Appl. No.: 10/887,135

(22) Filed: Jul. 8, 2004

(65) Prior Publication Data

US 2005/0206411 A1  Sep. 22, 2005

(30) Foreign Application Priority Data

Mar. 18, 2004  (KR)  ............. 10-2004-0018484

(51) Int. Cl.
*H03K 19/0175* (2006.01)
(52) U.S. Cl. ............... 326/83; 365/230.06; 365/189.11
(58) Field of Classification Search .............. 326/82, 326/83, 86, 90; 365/230.06, 189.11
See application file for complete search history.

(56) References Cited

U.S. PATENT DOCUMENTS

| | | | | |
|---|---|---|---|---|
| 5,504,715 A | * | 4/1996 | Lee et al. ............ | 365/230.06 |
| 5,708,373 A | * | 1/1998 | Inoue ................. | 326/88 |
| 5,940,333 A | * | 8/1999 | Chung ................ | 365/189.09 |
| 6,069,837 A | * | 5/2000 | Micheloni et al. ..... | 365/230.06 |
| 6,930,536 B1 | * | 8/2005 | Nazarian et al. ...... | 327/536 |
| 2003/0048662 A1 | * | 3/2003 | Park et al. ........... | 365/185.18 |
| 2003/0151958 A1 | * | 8/2003 | Mihara ............... | 365/189.11 |

* cited by examiner

*Primary Examiner*—Don Le
(74) *Attorney, Agent, or Firm*—Ladas & Parry LLP

(57) ABSTRACT

The device for generating the bit line signal to enable a column transistor that is connected to a bit line and a local line in a semiconductor memory device includes at least a column decoder and a chain of connected inverters. The column decoder decodes a column address signal. The chain of connected inverters has an input terminal for receiving a first signal outputted from the column decoder and an output terminal for outputting a second signal to drive the column transistor. The second signal voltage is held substantially same as the first signal voltage for a predetermined time. After the predetermined time, the second signal voltage is held at a higher voltage than the first signal voltage to improve the current driving capacity of the column transistor. This increases the transmission speed of the signal transmitted from the bit line to the local input/output line.

5 Claims, 2 Drawing Sheets

DEVICE FOR GENERATING A BIT LINE SELECTION SIGNAL OF A MEMORY DEVICE

BACKGROUND OF THE INVENTION

1. Field of the Invention

The present invention relates generally to a device for generating a bit line selection signal in a semiconductor memory device, and more particularly to a device for generating a bit line selection signal to optimally facilitate the high speed operations of a semiconductor memory device.

2. Description of the Related Art

High-speed and high-integration are the two key technological factors in the modern semiconductor memory design. However, as the memory device is becoming highly integrated, meeting every specification of the speed related parameters is becoming increasingly more difficult. For example, the signal lines in a highly integrated memory device are likely to be elongated more thinly, and this tends to cause more RC delays, making more difficult to meet the the speed related parameters.

Another factor that should not be neglected to meet the speed related parameters in a memory device is to optimally minimize the time required to transfer data from a bit line to a local line in the memory device.

FIG. 1 shows a bit line selection signal generator 102 for use in a memory device to allow transfer of data from bit lines (labeled BIT, /BIT) to local input/output lines (labeled LIO, /LIO). As shown in FIG. 1, a sense amplifier 100 is located between the bit lines BIT, /BIT. The bit lines BIT, /BIT and the local input/output lines LIO, /LIO are separated by column transistors 11, 12.

The gates of the column transistors 11, 12 are connected to a bit line selection signal Yi outputted by a bit line selection signal generator 102. The bit line selection signal Yi enables particular column transistors 11, 12 that correspond to a bit line selected according to a column address inputted to a column decoder 200 as shown in FIG. 2.

Now referring to FIG. 2, the bit line selection signal generator 102 includes the column decoder 200, which has a NAND gate 21 and an inverter 22. The NAND gate 21 receives the column address signal, and the inverter 22 inverts the output signal of the NAND gate 21. Based on the NAND gate 21 output signal, the bit line selection signal Yi is generated. In this regard, the bit line selection signal Yi may be understood also as the column address decoder signal.

The NAND gate 21 and the inverter 22 of FIG. 2 are driven by an external power voltage VEXT, which is also the driving voltage of the memory device itself. Consequently, the voltage of the bit line selection signal Yi, which would enable the column transistors 11, 12, is the same voltage of the VEXT.

One speed related parameter that measures the time taken for a semiconductor memory device to output data in response to a read command is known as tAA. One significant factor that affects the tAA is the driving capacity of the column transistors 11, 12 (FIG. 1). As already discussed, the column transistors 11, 12 are enabled by the bit line selection signal Yi, which is generated by the bit line selection generator 102. As the driving capacity of the column transistors 11, 12 becomes greater, the speed for transmitting data from the bit line BIT, /BIT to a local line LIO, /LIO would be faster.

The external power voltage VEXT, which is the driving voltage for the memory device itself, is typically applied to the gates of the column transistors 11, 12 as the bit line selection signal Yi. The VEXT in a DDR SDRAM is 2.5 V; thus, voltage of the bit line selection signal Yi in a DDR SDRAM is also 2.5 V. Utilizing 2.5 V to enable the column transistors 11, 12 in a DDR SDRAM appears to present no serious technical problems for operating the column transistors 11, 12.

However, technical problems lie in the next-generation semiconductor memory devices, such as DDR2 SDRAM, in which the external power voltage VEXT utilized is below 2.5 V, and more typically less than 1.8 V. Thus, the voltage level of Yi signal in the next generation memory devices applied to the gates of the column transistors would be lower than 1.8 V and cause very poor tAA when it is compared to the tAA of DDR SDRAM.

SUMMARY OF THE INVENTION

Against this backdrop, the present invention has been developed. The present invention provides, inter alia, a circuit for securing a sufficient specification margin required for high-speed operations in any semiconductor memory device. The present invention improves signal transmission speed of data from a bit line selected by a column address.

A device according to an embodiment of the present invention generates a bit line selection signal for enabling a column transistor connected to a bit line and a local input/output line in a semiconductor memory device. The device of the present invention includes at least a column decoder and a chain of connected inverters.

The column decoder decodes a column address signal received during a read operation. The chain of connected inverters has an inverter chain input terminal for receiving a first signal outputted from the column decoder and an inverter chain output terminal for outputting a second signal to drive the column transistor.

The voltage of the second signal outputted at the inverter chain output terminal is held substantially same as the voltage of the first signal for a predetermined time.

After the predetermined time, the voltage of the second signal outputted at the inverter chain output terminal is held at a higher voltage than the voltage of the first signal to improve the current driving capacity of the column transistor that increases the transmission speed of the signal transmitted from the bit line to the local input/output line.

The column decoder at least includes a NAND gate and an inverter connected to the NAND gate. The NAND gate receives a column address signal. The inverter connected to the NAND gate outputs the first signal based on the output signal of the NAND gate such that the driving voltage applied to the NAND gate and the inverter substantially equals the voltage of the first signal.

The chain of inverters at least includes an even number of serially connected inverters. The driving voltage applied to the chain of inverters substantially equals the voltage of the second signal.

The predetermined time in which the first signal is generated at the inverter chain output terminal is determined by the number of inverters that are serially connected in the chain. The total duration in which the first and second signals are outputted from the inverter chain output terminal to the gate transistor is substantially determined by the duration of the column address signal being applied to the column decoder.

These and other features as well as advantages, which characterize the present invention, will be apparent from a reading of the following detailed description and a review of the associated drawings.

DETAILED DESCRIPTION OF PREFERRED EMBODIMENTS

Figure 1:
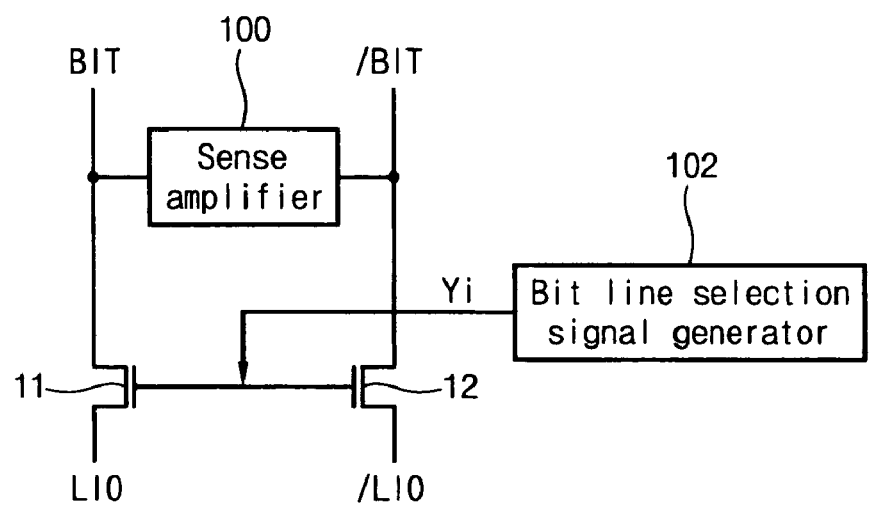
FIG. 1 is a functional block diagram of a conventional bit line selection signal generator for use in one type of semiconductor memory devices.

Wherever appropriate, same reference numerals are used to refer to the same or like parts in the description and/or the drawings.

In general, a semiconductor memory device outputs data after an active command (such as a read command) is issued to enable a word line. To do so, the memory device outputs the data available on a specific bit line corresponding to the selected column address. Typically, the column address is inputted at the same time when a read command is issued. The data, which has been made available on the bit line selected by the column address, is transmitted to a data output pad through local and global lines.

It is desired to optimize the speed parameter tAA in any semiconductor memory devices, especially in those that are highly integrated. The present invention provides solutions to these technical challenges. In general, the circuit according to an embodiment of the present invention reduces the tAA by enhancing the operational performance of the column transistors that connect the bit line and the local line.

Figure 3:
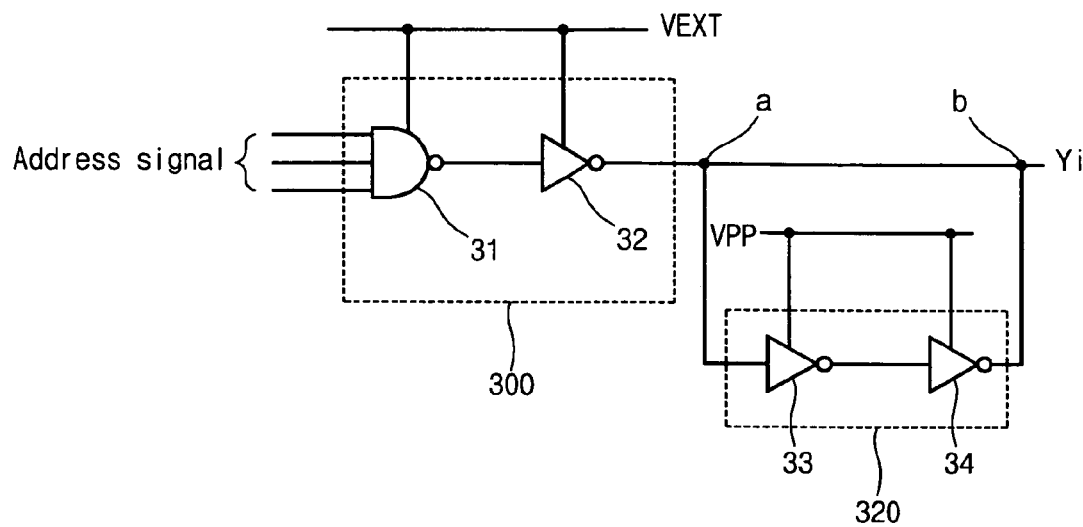
FIG. 3 is an internal circuit diagram of a bit line selection signal generator in accordance with an embodiment of the present invention.

Shown in FIG. 3 is an internal circuit diagram of a bit line selection signal generator according to an embodiment of the present invention. As can be readily understood in view of the foregoing discussions, Yi in FIG. 3 would enable the column transistors in a memory device (such as those 11, 12 shown in FIG. 1), but with a notable improvement in tAA.

Referring to FIG. 3, the bit line selection signal generator according to an embodiment of the present invention includes a column decoder 300 and an inverter chain unit 320.

Figure 2:
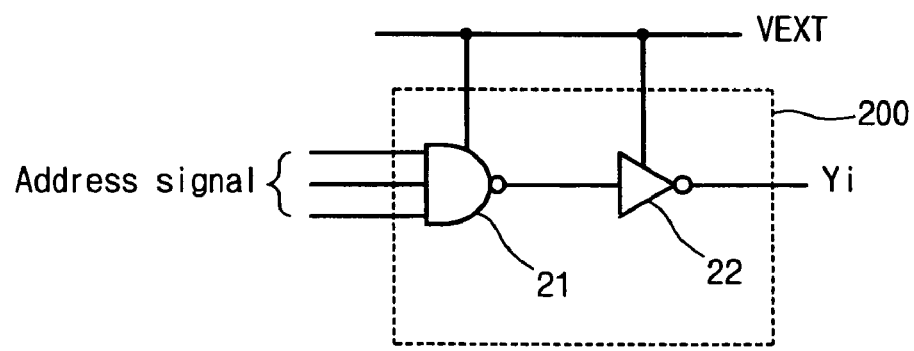
FIG. 2 is an internal circuit diagram of a conventional bit line selection signal generator.

For discussion purposes, the column decoder 300 is shown as being identical to the bit line selection signal generator 200 of FIG. 2; however, it should be readily understood that other equivalent circuit structures may also be possible. The column decoder 300 as shown in FIG. 3 includes a NAND gate 31 for receiving a column address signal and an inverter 32 for receiving an output signal of the NAND gate 31.

The output node (a) of the column decoder 300 as shown in FIG. 3 is also the output node (b) of the inverter chain unit 320. The output node (b) is connected to the output node (a) through conductive materials.

The inverter chain unit 320 includes one or more (more typically an even number of) inverters 33, 34. By adjusting the number of inverters 33, 34, the delay time can be adjusted. An input terminal of the inverter 33 is connected to the node (a) while an output terminal of the inverter 34 is connected to the node (b). For example, the input terminal of a chain of serially connected even number of inverters is connected to the node (a), and the output terminal of the chain of the same serially connected even numbered inverters is connected to the node (b).

A bit line selection signal Yi having a voltage level of the node (b) would then be applied to the gates of the column transistors (such as those 11, 12 shown in FIG. 1, but not shown in FIG. 3).

As shown in FIG. 3, an external power voltage VEXT is fed to the column decoder 300 to drive the NAND gate 31 and the inverter 32. On the other hand, a driving voltage of the inverters 33, 34 is a different voltage VPP. Here, the voltage level of VPP, generated from an internal voltage generator, is higher than that of the external power voltage VEXT.

The external power voltage VEXT is applied to the column decoder 300, and thus the voltage at the node (a) outputted from the column decoder 300 is the VEXT. However, the voltage at node (b) outputted from the inverter chain unit 320 would be the VPP, since the driving voltage of the inverters 33, 34 is VPP (but at a predetermined time delay adjustable according to the number of inverters in the inverter chain unit 320).

A column address signal applied according to a read command from the memory device is inputted to the NAND gate 31. Therefore, the inverter 32 outputs the voltage of VEXT, and thus the voltage level of the bit line selection signal Yi becomes the VEXT at the node (a).

The output voltage of the inverter 32 is applied to the inverter chain unit 320. After a predetermined time, the voltage level outputted from the inverter 34 is therefore the VPP. In other words, the voltage level of the bit line selection signal Yi rises from the VEXT to the VPP.

As the voltage level of the bit line selection signal Yi rises, a current driving capacity of the column transistor also improves. This in turn shortens a charge sharing time between the bit line and the local line. As a result, the tAA is reduced.

Figure 4:
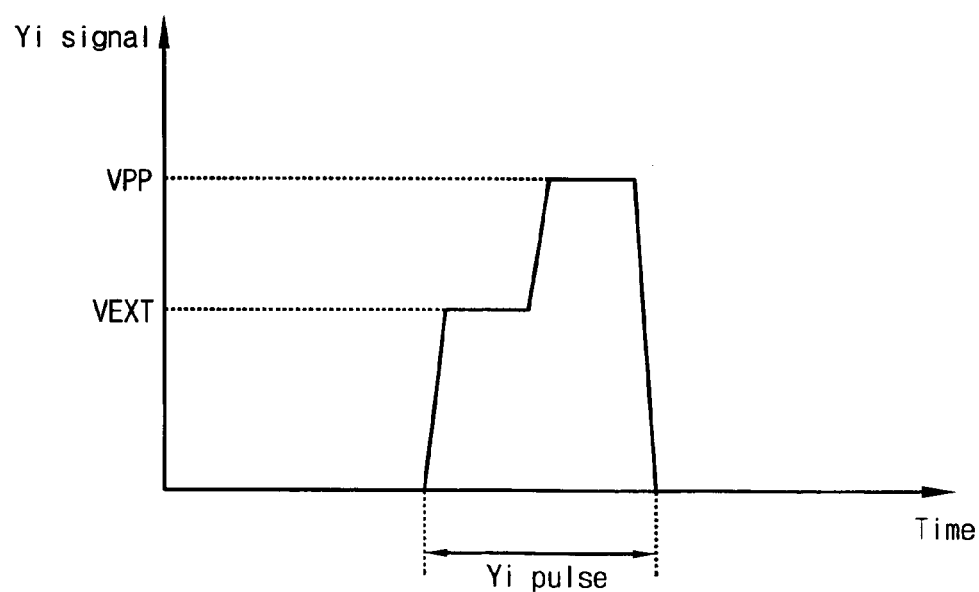
FIG. 4 is a waveform diagram of a bit line selection signal in accordance with an embodiment of the present invention.

FIG. 4 shows the voltage waveform of the bit line selection signal Yi according to an embodiment of the present invention, which has been explained with reference to FIG. 3.

As shown in FIG. 4, the voltage level of Yi remains at the VEXT level for a predetermined time and then rises to the VPP level under the influence of the inverter chain unit 320 (in FIG. 3). The point in time when the high voltage VPP of the bit line selection signal Yi changes to a low level depends on the point in time when the address signal inputted to the column decoder 300 changes. Therefore, the total pulse width of the bit line selection signal Yi remains unchanged.

The circuit of the present invention improves the current driving capacity of the column transistors by gradually increasing a turn-on voltage applied to the gates of the column transistors. This improves the transmission speed of the amplified bit line voltage by the sense amplifier (such as 100 in FIG. 1) to the local line (such as LIO, /LIO). The circuit of the present invention therefore can be used advantageously to improve the charge sharing speed of the bit line and the local line, resulting in the reduction of the tAA. In addition, the circuit of the present invention can be used for reducing the charge sharing time between the local line and the global line.

The inverter chain unit 320 according to an embodiment of the present invention outputs a higher voltage than the output voltage of the column decoder 300 after a predetermined time delay. Thus, the inverter chain unit 320 can be implemented for use in other circuits that require a voltage higher than the output voltage of the column decoder 320 to be outputted after a predetermined delay time.

As already described above, the present invention is capable of increasing the turn-on voltage applied to the gate of the column transistor, and of improving the operational characteristics of the column transistor(s) that is enabled by a column address signal. Thus, the present invention provides significant advantages and improvements for high-speed operations in the next-generation semiconductor memory devices such as DDR2 SDRAM.

It will be clear that the present invention is well adapted to attain the ends and advantages as well as those inherent therein. While a presently preferred embodiment has been described for purposes of this disclosure, various changes and modifications may be made which are well within the scope of the present invention. Numerous other changes may be made which will readily suggest themselves to those skilled in the art and which are encompassed in the spirit of the invention disclosed and as defined in the appended claims.

What is claimed is:

1. A device for generating a bit line selection signal for enabling a column transistor connected to a bit line and a local input/output line in a semiconductor memory device, comprising:
    a column decoder for decoding a column address signal received during a read operation; and
    a chain of connected inverters having an inverter chain input terminal for receiving a first signal outputted from the column decoder and having an inverter chain output terminal for outputting a second signal to drive the column transistor,
    wherein the voltage of the second signal is held substantially same as the voltage of the first signal for a predetermined time, and
    wherein, after the predetermined time, the voltage of the second signal is held at a higher voltage than the voltage of the first signal to improve the current driving capacity of the column transistor and to increase the transmission speed of the signal transmitted from the bit line to the local input/output line.

2. The device according to claim 1, wherein the column decoder comprises:
    a NAND gate for receiving a column address signal; and
    an inverter connected to the NAND gate for outputting the first signal based on the output signal of the NAND gate,
    wherein the driving voltage applied to the NAND gate and the inverter substantially equals the voltage of the first signal.

3. The device according to claim 1, wherein the chain of inverters comprises an even number of serially connected inverters and the driving voltage applied to the chain of inverters substantially equals the voltage of the second signal.

4. The device according to claim 3, wherein the predetermined time is determined by the number of serially connected inverters in the chain.

5. The device according to claim 4, wherein the total duration in which the first and second signals are outputted from the inverter chain output terminal to the gate transistor is substantially determined by the duration of the column address signal being applied to the column decoder.

* * * * *